(12) United States Patent
Kim et al.

(10) Patent No.: US 11,483,676 B2
(45) Date of Patent: Oct. 25, 2022

(54) TRANSMITTING DEVICE FOR CART HAVING AUTO FOLLOWING FUNCTION

(71) Applicant: LG ELECTRONICS INC., Seoul (KR)

(72) Inventors: Anna Kim, Seoul (KR); Sunryang Kim, Seoul (KR); Keunsik No, Seoul (KR); Hye Ri Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 202 days.

(21) Appl. No.: 16/771,461

(22) PCT Filed: Apr. 30, 2019

(86) PCT No.: PCT/KR2019/005217
§ 371 (c)(1),
(2) Date: Jun. 10, 2020

(87) PCT Pub. No.: WO2020/222331
PCT Pub. Date: Nov. 5, 2020

(65) Prior Publication Data
US 2021/0258728 A1   Aug. 19, 2021

(51) Int. Cl.
*H04W 4/029* (2018.01)
*H02J 50/10* (2016.01)
*G05D 1/02* (2020.01)
*G05D 1/12* (2006.01)
*G06K 7/10* (2006.01)
(Continued)

(52) U.S. Cl.
CPC ............ *H04W 4/029* (2018.02); *G05D 1/028* (2013.01); *G05D 1/12* (2013.01); *G06K 7/10306* (2013.01); *G06K 19/071* (2013.01);
*G06K 19/0702* (2013.01); *G06K 19/07713* (2013.01); *G06K 19/07762* (2013.01); *H02J 7/02* (2013.01); *H02J 50/10* (2016.02); *H04B 1/034* (2013.01);
(Continued)

(58) Field of Classification Search
None
See application file for complete search history.

(56) References Cited

U.S. PATENT DOCUMENTS

2006/0223518 A1* 10/2006 Haney ..................... H04L 67/54
                                                               455/420
2008/0185431 A1*  8/2008 Toyokawa ......... G06Q 30/0281
                                                               235/385
(Continued)

FOREIGN PATENT DOCUMENTS

CN         108828574 A       6/2017
KR    20-2010-0009663 U     10/2010
(Continued)

*Primary Examiner* — Frantz Bataille
(74) *Attorney, Agent, or Firm* — Birch, Stewart, Kolasch & Birch, LLP

(57) ABSTRACT

Provided is a transmitting device for a cart with an auto following function, which can sense the position and moving path of a user and move while following the user.
The transmitting device for a cart provides a sensing and communication function such that the cart with the auto following function can sense and follow the position of the transmitting device. Thus, the cart can sense and follow the position of the transmitting device.
Furthermore, since the transmitting device for a cart can be conveniently worn like a watch, a user's convenience can be improved.

18 Claims, 11 Drawing Sheets

(51) Int. Cl.
  *G06K 19/07*   (2006.01)
  *G06K 19/077*  (2006.01)
  *H02J 7/02*    (2016.01)
  *H04B 1/034*   (2006.01)
  *H05K 5/00*    (2006.01)

(52) U.S. Cl.
  CPC ... *H05K 5/0004* (2013.01); *G05D 2201/0216* (2013.01)

(56) References Cited

U.S. PATENT DOCUMENTS

2011/0012796 A1   1/2011   Kim et al.
2015/0365119 A1   12/2015  Shin et al.
2019/0236583 A1*  8/2019   Hagen ................ G06Q 30/0635

FOREIGN PATENT DOCUMENTS

| KR | 10-2011-0006999 A | 1/2011 |
| KR | 10-1415967 B1 | 7/2014 |
| KR | 10-1531208 B1 | 6/2015 |
| KR | 10-2016-0134449 A | 11/2016 |
| KR | 10-1780213 B1 | 9/2017 |

* cited by examiner

[FIG. 1]
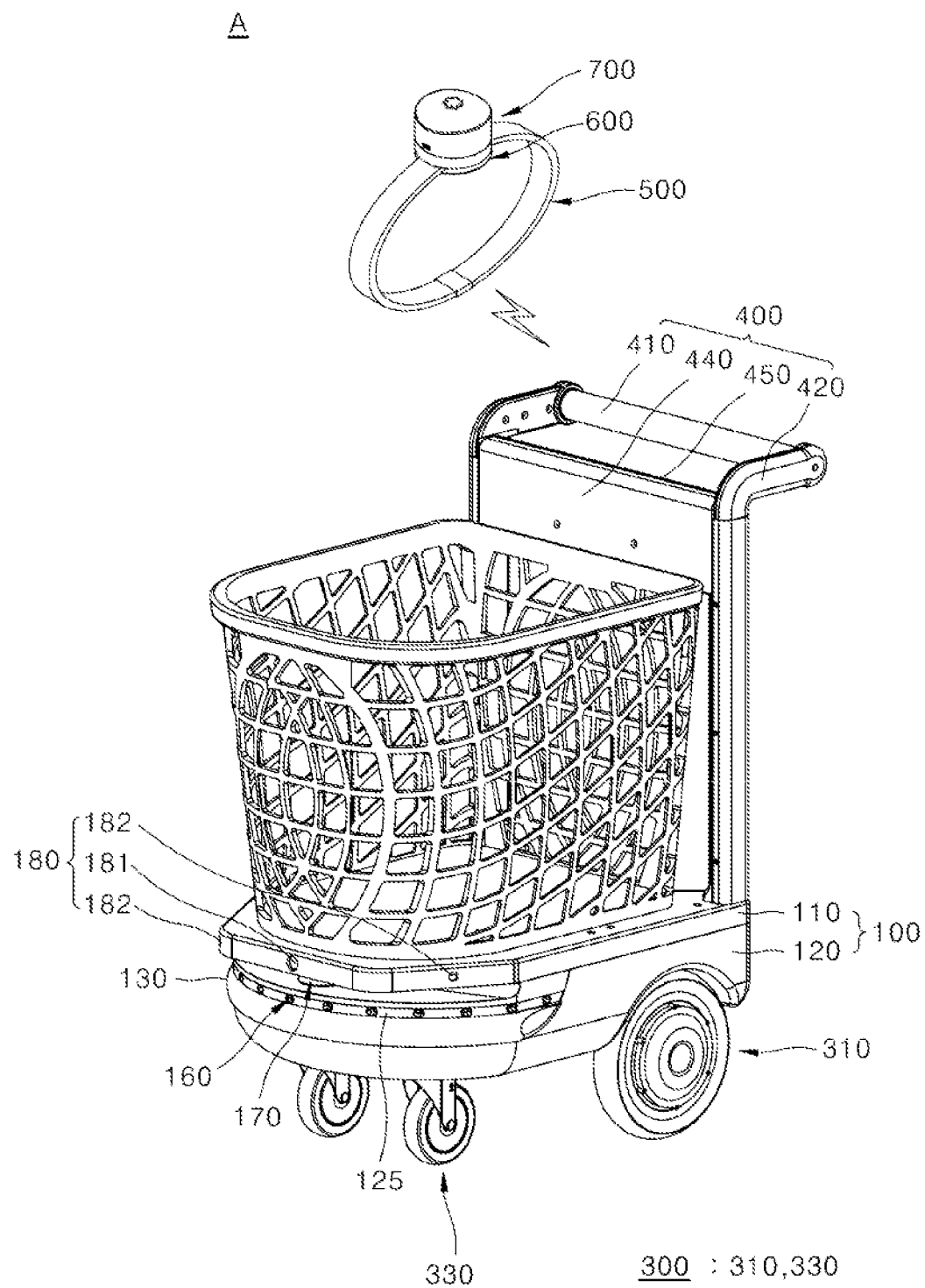

[FIG. 2]
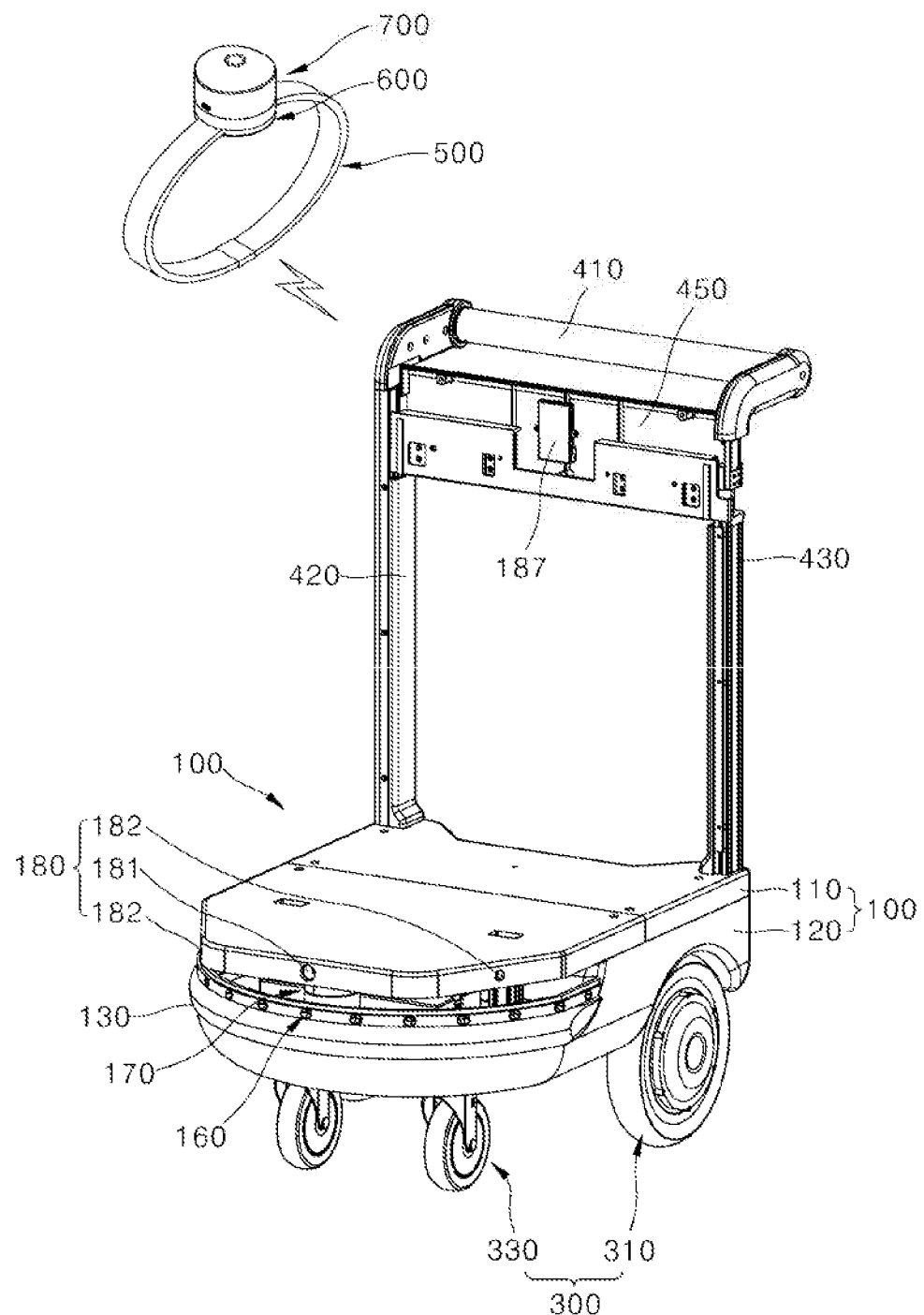

【FIG. 3】
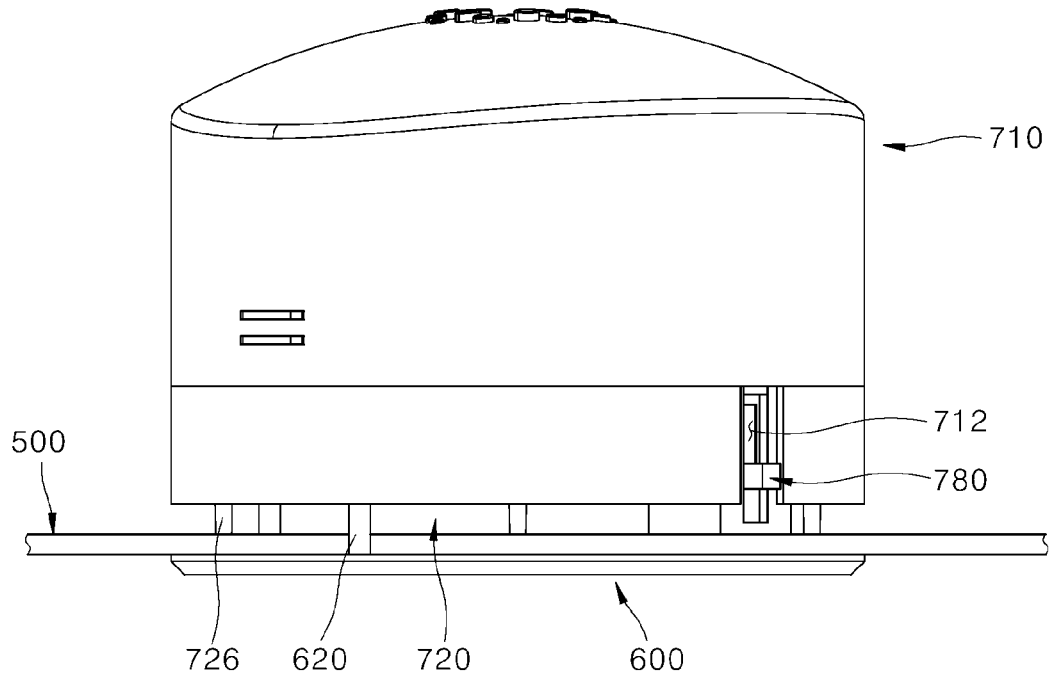
700 : 710, 720

[FIG. 4]
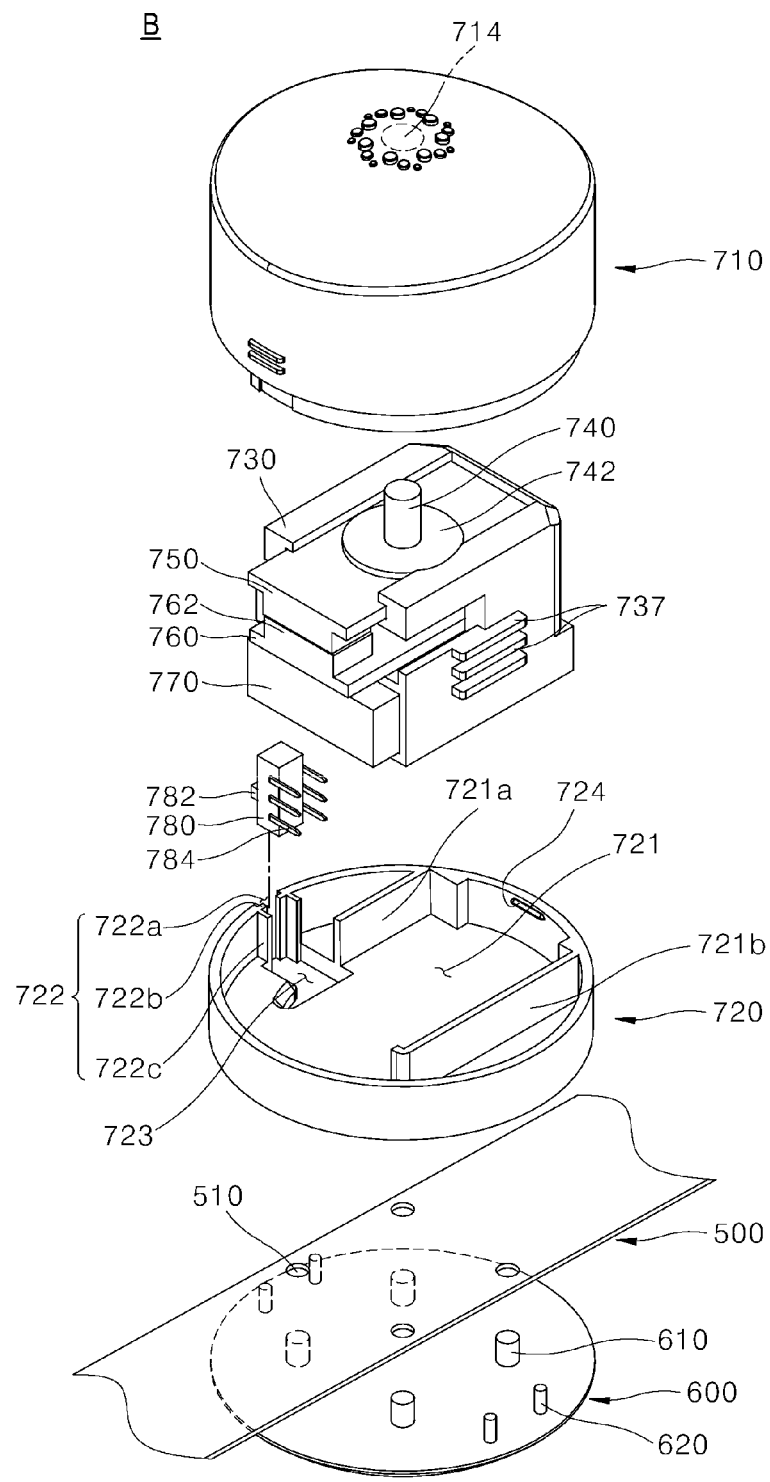
700: 710,720,730,740,750,760,770,780

[FIG. 5]
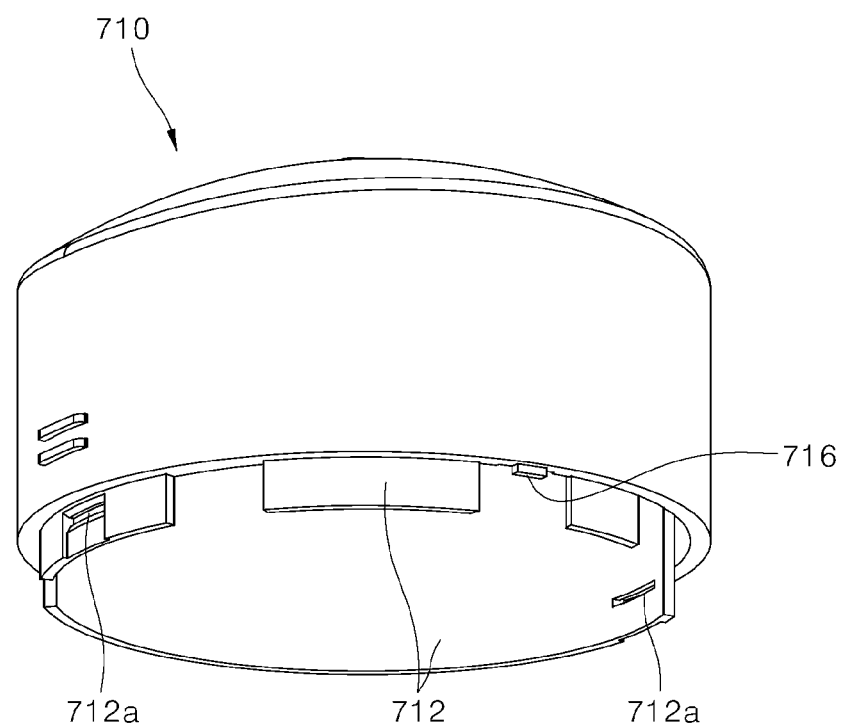

[FIG. 6]
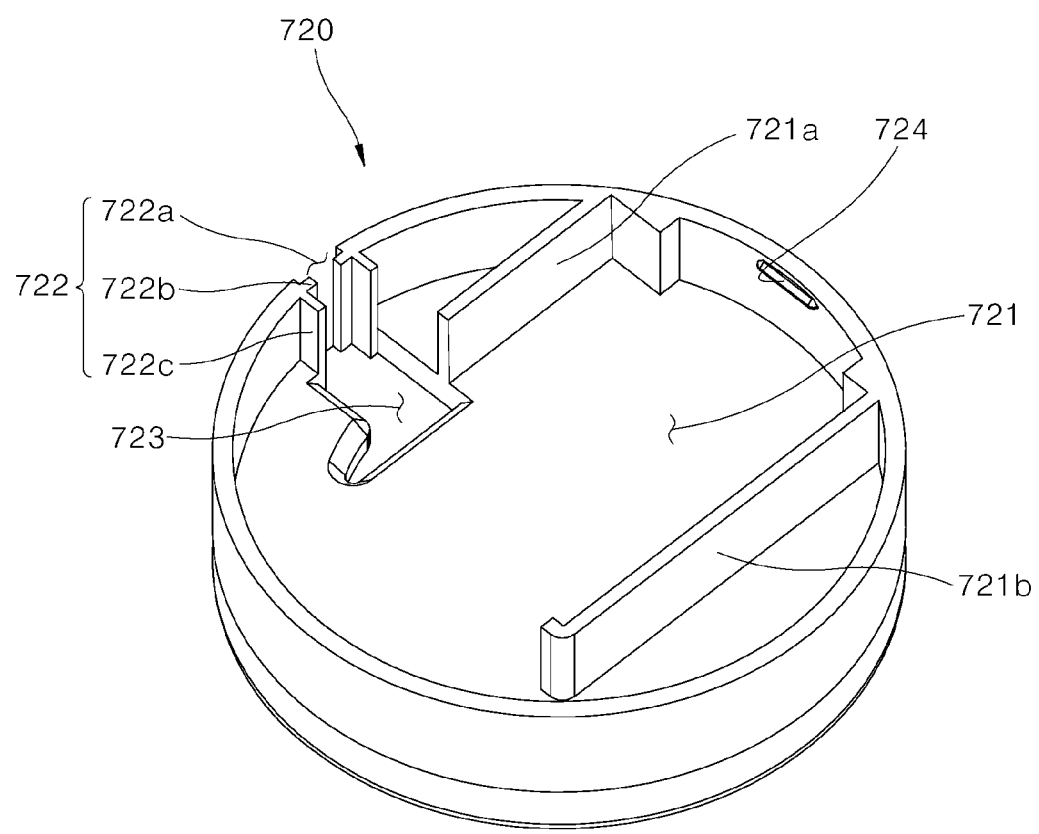

[FIG. 7]
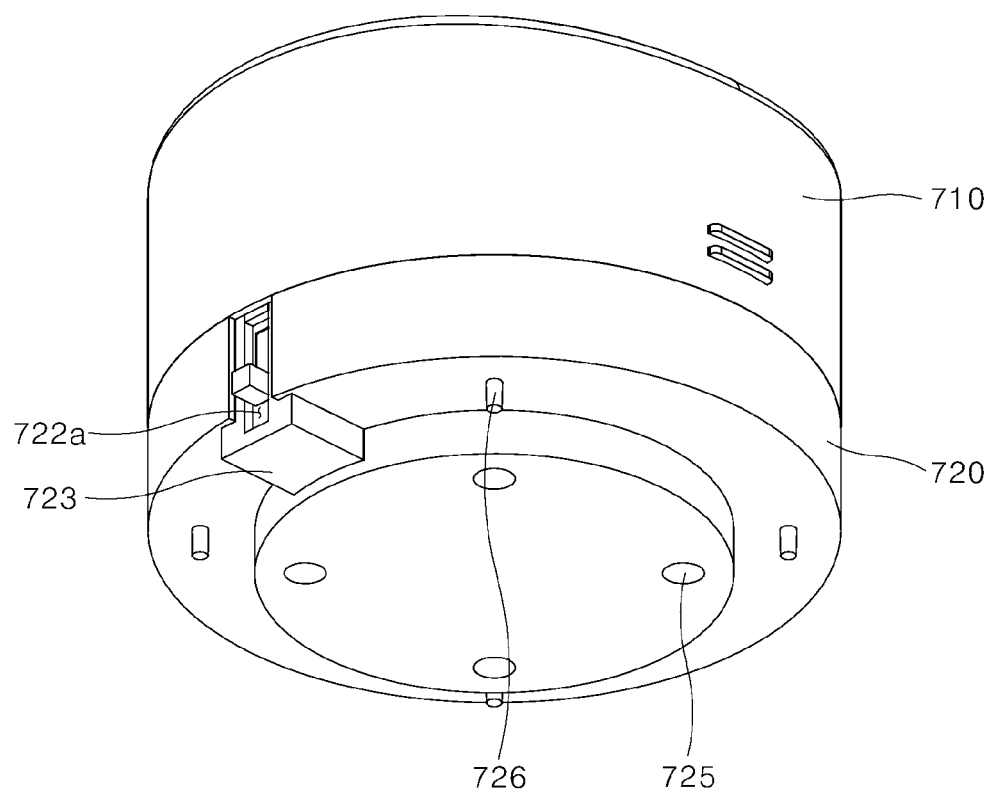

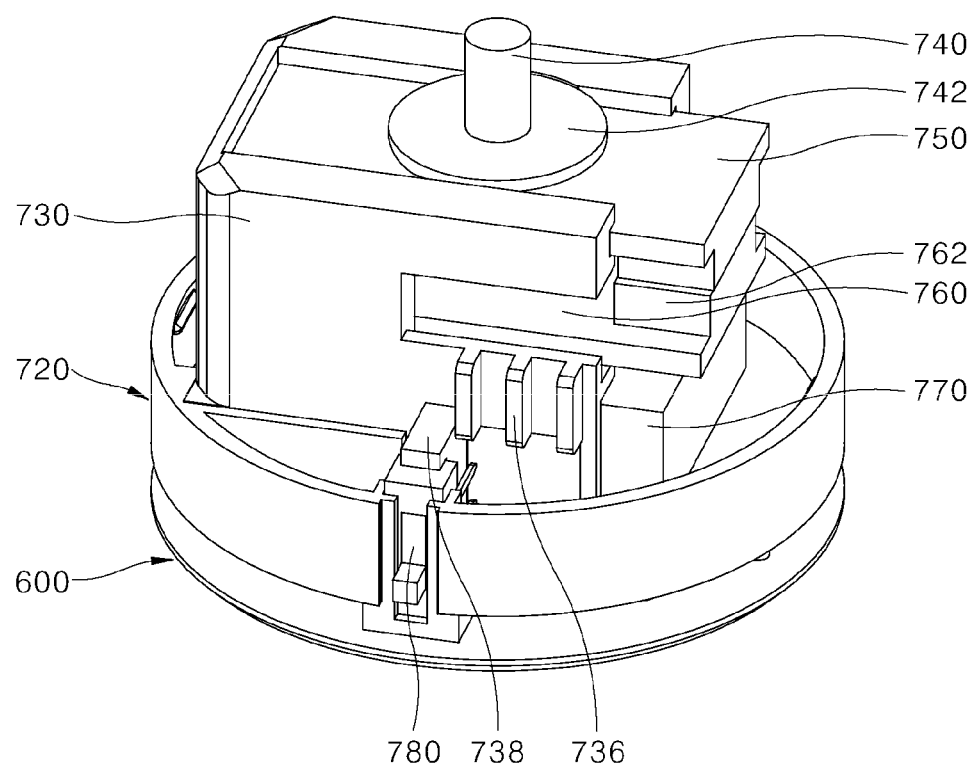
[FIG. 8]

[FIG. 9]
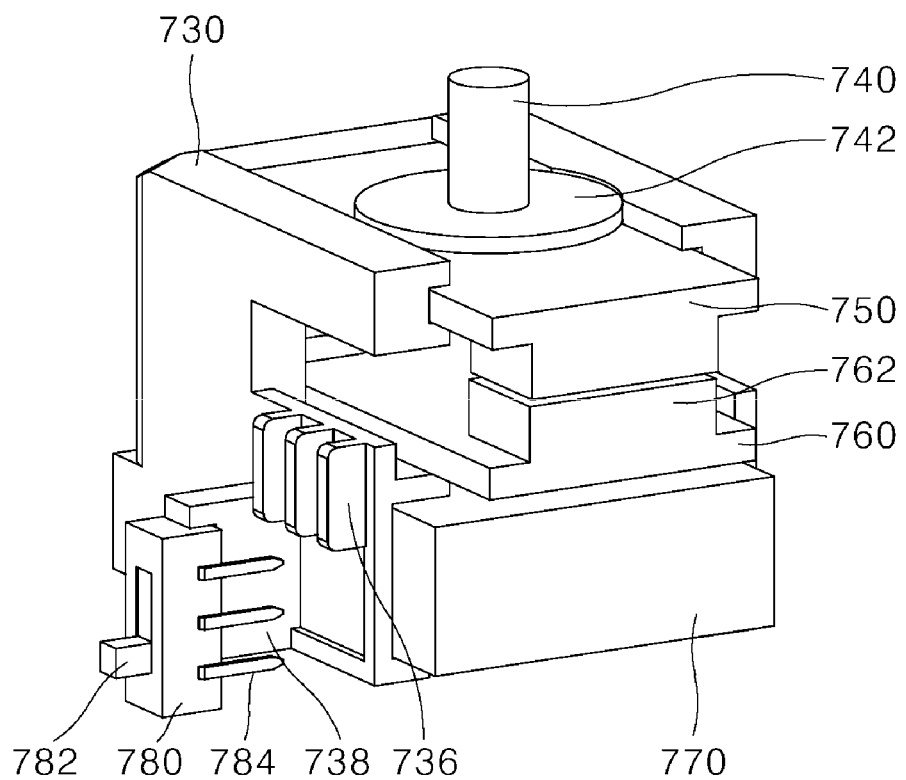

[FIG. 10]
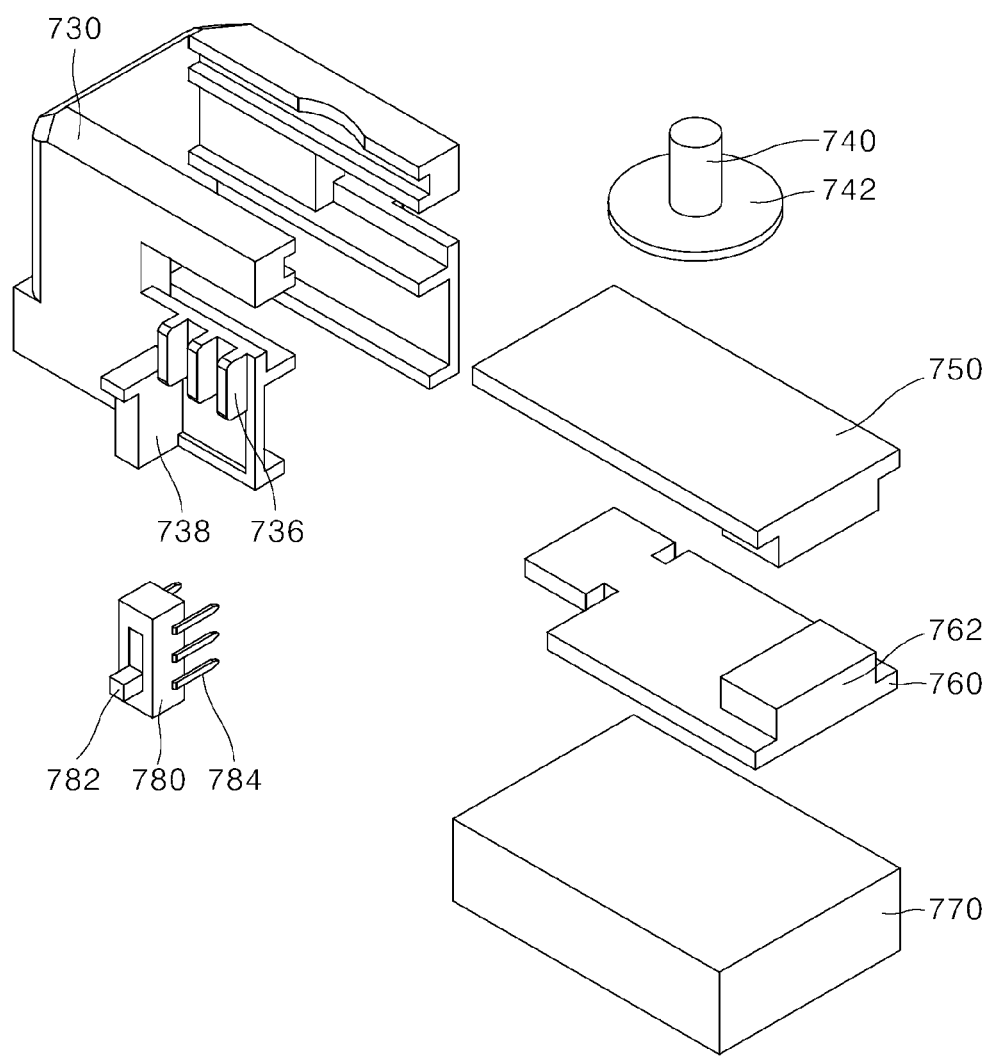

[FIG. 11]
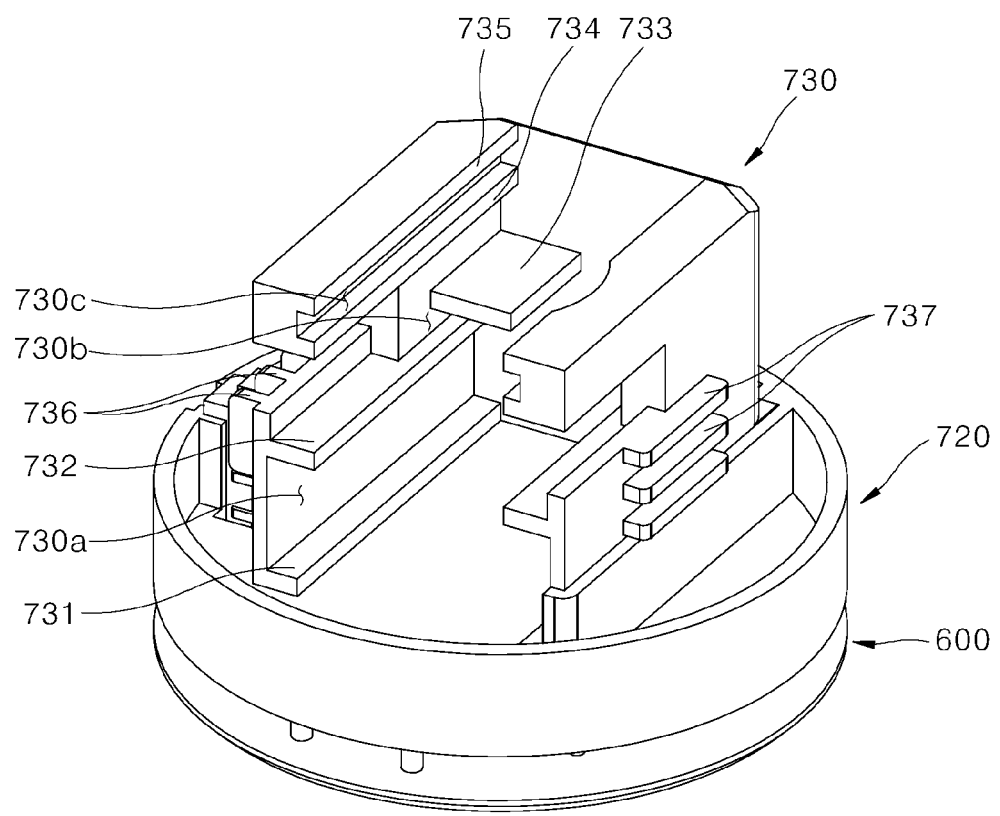

500
TRANSMITTING DEVICE FOR CART HAVING AUTO FOLLOWING FUNCTION

CROSS-REFERENCE TO RELATED APPLICATIONS

This application is the National Phase of PCT International Application No. PCT/KR2019/005217 filed on Apr. 30, 2019, the contents of which are hereby expressly incorporated by reference into the present application.

TECHNICAL FIELD

The present disclosure relates to a transmitting device for a cart having an auto following function, which a user wears for a cart to automatically follow the position of a transmitting device.

BACKGROUND ART

In a large retail store, a department store, an airport and the like, various types of carts are used for users to carry heavy objects or luggage.

A cart used in a space for shopping, such as a large retail store or department store, has a plurality of wheels installed at the bottom of a basket for storing items, and is moved by a user who pushes or pulls a handle. Since the cart enables the user to move without carrying a large quantity of items or heavy items in person, the cart is necessary for the user's convenience.

Conventionally, a user moves a cart by handling the cart in person. In many cases, however, a user may move away from the cart while checking various kinds of products. In this case, the user needs to return to the cart and move the cart or needs to move to the cart while carrying an item.

Therefore, there is a need for the development of a method which can remove such inconvenience, and enable a user to easily move or handle a cart while freely moving.

DISCLOSURE

Technical Problem

Various embodiments are directed to a transmitting device for a cart having an auto following function, which can sense the position and moving path of a user, and move while following the user.

Technical Solution

The purposes of the present disclosure are not limited to the above-described purposes, and other purposes and advantages of the present disclosure, which are not described herein, will be understood by the following descriptions, and clarified by embodiments of the present disclosure. Furthermore, it will be obvious that the purposes and advantages of the present disclosure can be realized by units described in claims and combinations thereof.

Advantageous Effects

The transmitting device for a cart in accordance with the embodiment of the present disclosure provides the sensing and communication function such that the cart with the auto following function can sense and follow the position of the transmitting device. Thus, the cart can sense and follow the position of the transmitting device.

Furthermore, since the transmitting device for a cart can be conveniently worn like a watch, a user's convenience can be improved.

Furthermore, since the transmitting device for a cart is automatically charged while mounted on the cart, a separate part for charging is not necessary.

Specific effects of the present disclosure with the above-described effects will be described while details for embodying the present disclosure are described.

BRIEF DESCRIPTION OF DRAWINGS

FIG. 1 is an expanded perspective view illustrating a cart and a transmitting device in accordance with an embodiment of the present disclosure.

FIG. 2 is an expanded perspective view illustrating main components of the cart and the transmitting device in FIG. 1.

FIG. 3 is a perspective view illustrating the transmitting device in accordance with the embodiment of the present disclosure.

FIG. 4 is an exploded perspective view of the transmitting device of FIG. 3.

FIG. 5 is a perspective view illustrating an upper case of a transmitting module of FIG. 3.

FIG. 6 is a perspective view illustrating a lower case of the transmitting module of FIG. 3.

FIG. 7 is a bottom perspective view of the transmitting module of FIG. 3.

FIG. 8 is a perspective view illustrating an internal structure of the transmitting module of FIG. 3.

FIG. 9 is an assembled perspective view illustrating main components of the transmitting module of FIG. 8.

FIG. 10 is an exploded perspective view illustrating the main components of the transmitting module of FIG. 9.

FIG. 11 is a perspective view illustrating a module frame of the transmitting module of FIG. 9.

MODE FOR DISCLOSURE

Hereafter, exemplary embodiments of the present disclosure will be described in detail with reference to the accompanying drawings.

The above-described purposes, features and advantages will be described in detail with reference to the accompanying drawings. Thus, the technical idea of the present disclosure can be easily carried out by those skilled in the art to which the present disclosure pertains. Moreover, detailed descriptions related to publicly known functions or configurations will be ruled out in order not to unnecessarily obscure subject matters of the present disclosure. Hereafter, various embodiments will be described in detail with reference to the accompanying drawings. The same reference numerals in the drawings are used to represent like or similar components.

Hereafter, when an arbitrary component is disposed "at the top (or bottom)" of a component or "over (or under)" the component, it may not only indicate that the arbitrary component is disposed in contact with the top surface (or bottom surface) of the component, but also indicate that another component can be interposed between the component and the arbitrary component disposed over or under the component.

Furthermore, when a certain component is referred to as being "connected to" or "coupled to" another component, it may not only indicate that the components may be directly connected to or coupled to each other, but also indicate that another component is "interposed" between the respective components or the components may be "connected" or "coupled" to each other through another component.

Hereafter, "cart" indicates a device that is manually moved under control of a user or moved by electrical power. The cart may or may not include a function of containing objects. The cart may be used for shopping spaces such as large retail stores, department stores or small-to-medium stores, leisure spaces such as golf courses, and moving spaces such as airports or harbors.

FIG. 1 is an expanded perspective view illustrating a cart and a transmitting device in accordance with an embodiment of the present disclosure. FIG. 2 is an expanded perspective view illustrating main components of the cart and the transmitting device in FIG. 1.

As illustrated in FIGS. 1 and 2, a cart 10 in accordance with an embodiment of the present disclosure includes a main body 100 having main components mounted therein, a storage part 200 installed on the main body 100, a wheel assembly 300 coupled to the bottom of the main body 100 and having main wheels 330 and auxiliary wheels 300, and a handle assembly 400 coupled to the rear of the main body 100.

The main body 100 includes an upper frame 110 and a main housing 120 which are coupled to each other. Various components are mounted inside and outside the main body 100. Inside the main housing 120, a battery (not illustrated), a main PCB module (not illustrated), a first sensor module 160 and a second sensor module 170 are mounted. The upper frame 110 has a third sensor module 180 mounted thereon. The main housing 120 has a bumper 130 mounted at the front thereof to protect the main body 100 from a collision.

Although not illustrated in the drawings, the battery is stored in the main housing 120, and electrically connected to the main wheels 310 and a controller within the main PCB module. The battery is charged and discharged under control of the controller, and serves to provide an assist force to the main wheel 310. Furthermore, the battery supplies power to a transmitting device B worn by a user, when the transmitting device B is mounted at a charging position on the cart A. For this structure, although not illustrated in the drawings, a charging port for wired charging or a coil pad having a transmitting coil for wireless charging may be installed on one side of the main body 100 or the handle assembly 400.

Although not illustrated, the main PCB module includes the controller, and controls overall operations of the cart A based on results sensed by the first to third sensor modules 160 to 180 and a force sensing module (not illustrated).

The first sensor module 160 is a TOF (Time of Flight) sensor mounted on a sensor bracket 125. In an embodiment, the plurality of first sensor modules 160 are installed. The first sensor module 160 is used to sense obstacles at the front and sides of the cart 10. The first sensor module 160 may sense the bottom of a product stand which is a fixed obstacle among obstacles.

The second sensor module 170, which is implemented as a lidar sensor, is disposed with a level difference from the first sensor module 160 such that the first sensor module 160 does not interfere with the sensing range of the second sensor module 170. Since the second sensor module 170 has a wide sensing range, the second sensor module 170 can sense moving obstacles or the legs of people other than the user, instead of the product stand which is a fixed obstacle.

The third sensor module 180 may include a pair of UWB (Ultra-Wideband) position sensors having a UWB antenna 182 and disposed at predetermined intervals from each other, a camera 181 installed between the position sensors, and a UWB main PCB 187. The third sensor module 180 is connected to the main PCB module, and serves to sense and follow the position of the transmitting device B for a user. Using the sensor module 180, the controller controls the cart A to move while automatically following the transmitting device B.

The UWB main PCB 187 may be installed in the handle assembly 400. The handle assembly 400 includes a handle bar 410 pushed or pulled by a user, a handle cover frame 420 and a handle support frame 430 for supporting the handle bar 410, and front and rear covers 440 and 450 for supporting a force sensing module (not illustrated) that senses the magnitude and direction of a force applied to the handle bar 410. The UWB main PCB 187 may be installed in a mounting space formed between the front and rear covers 440 and 450.

In order to provide the auto following function, the cart having the above-described structure requires the transmitting device B for a user, which can communicate with the cart. Hereafter, the transmitting device B for a user will be described in detail.

FIG. 3 is a perspective view illustrating the transmitting device for a cart in accordance with the embodiment of the present disclosure. FIG. 4 is an exploded perspective view of the transmitting device of FIG. 3. FIG. 5 is a perspective view illustrating an upper case of a transmitting module of FIG. 3. FIG. 6 is a perspective view illustrating a lower case of the transmitting module of FIG. 3. FIG. 7 is a bottom perspective view of the transmitting module of FIG. 3. FIG. 8 is a perspective view illustrating an internal structure of the transmitting module of FIG. 3. FIG. 9 is an assembled perspective view illustrating main components of the transmitting module of FIG. 8. FIG. 10 is an exploded perspective view illustrating the main components of the transmitting module of FIG. 9. FIG. 11 is a perspective view illustrating a module frame of the transmitting module of FIG. 9. In the drawings, the size of the transmitting device is exaggerated to describe the shape of the transmitting device for a user. In reality, however, the transmitting device for a user has a similar size to a general watch.

As illustrated in FIGS. 3 and 4, the transmitting device B for a user includes a wrist band 500 worn around the wrist of the user, a band coupling frame 600 disposed on the bottom surface of the wrist band 500 and coupled to the wrist band 500, and a transmitting module 700 disposed on the top surface of the wrist band 500 and coupled to the band coupling frame 600. All the components of the transmitting device B may be made of an insulating material to prevent signal interference with the sensors or occurrence of noise. Furthermore, all coupling structures of the transmitting device B can be coupled to each other without metallic fastening members such as bolts, for the same reason as described above.

The wrist band 500 is a band worn around the wrist of the user like a watch strap, and has an adjustable length. The wrist band 500 may be made of an elastic material such as silicone or rubber or a material such as soft plastic, in order to prevent signal interference with the sensors or occurrence of noise. The wrist band 500 has a plurality of fastening holes 510 formed therethrough so as to be coupled to the band coupling frame 600. The fastening holes 510 are formed at positions corresponding to fastening structures of the band coupling frame 600 which will be described below.

The band coupling frame 600 for coupling the transmitting module 700 to the wrist band 500 has a disk shape. Since the bottom surface of the band coupling frame 600 is contacted with the wrist of the user, the bottom surface of the band coupling frame 600 has a flat shape with no protrusions. The band coupling frame 600 has a plurality of first fastening bosses 610 and a plurality of second fastening bosses 620, which are formed on the top surface thereof and coupled to the transmitting module 700. All of the components of the band coupling frame 600 are made of an insulating material such as plastic, in order to prevent signal interference with the sensors or occurrence of noise.

The plurality of first fastening bosses 610 are coupled to the bottom of a lower case 720 of the transmitting module 700 through the fastening holes 510 formed in the wrist band 500. The first fastening bosses 610 may be formed in a cylindrical shape.

The plurality of second fastening bosses 620 may be formed at positions that do not interfere with the wrist band 500, respectively, with the first fastening bosses 610 coupled to the wrist band 500. The second fastening bosses 620 may be coupled to the lower case 720 of the transmitting module 700, and serve to guide the coupling position of the wrist band 500. The second fastening bosses 620 may be formed in a cylindrical shape. The second fastening bosses 620 may be inserted into holes formed in the lower case 720 and coupled to the lower case 720. Alternatively, as illustrated in the drawings, the second fastening bosses 620 may be inserted into coupling bosses 726 formed on the lower case 720 and coupled to the lower case 720.

The transmitting module 700 is coupled to the top of the band coupling frame 600 with the wrist band 500 interposed therebetween.

As illustrated in FIGS. 4 to 11, the transmitting module 700 includes a cylindrical upper case 710, the lower case 720 coupled to the upper case 710, and components stored between the upper case 710 and the lower case 720. The components include a module frame 730, a module UWB antenna 740, an antenna connector 742, a module sub PCB 750, a module main PCB 760, a battery 770 and a switch 780. The module frame 730 is seated in the lower case 720, and the module UWB antenna 740, the antenna connector 742, the module sub PCB 750, the module main PCB 760, the battery 770 and the switch 780 are coupled on the module frame 730.

As illustrated in FIGS. 4 and 5, the upper case 710 is a cylindrical case which is open downward. The upper case 710 has a thin plate-shaped coupling part 712 formed at the edge of the open bottom thereof so as to be inserted into the lower case 720. The coupling part 712 may have a plurality of hook holes 712a formed therethrough. Furthermore, the coupling part 712 may have one or more hooks 716 formed thereon. The hook hole 712a and the hook 716 are disposed at different positions from each other.

The upper case 710 may have an antenna hole 714 formed through the center of the closed top surface thereof. Furthermore, a portion of the upper case 710, corresponding to the position of the antenna hole 714, may have a smaller plate thickness than the other portions of the upper case 710, such that the antenna hole 714 has no influence on the operation of the module UWB antenna 740 which will be described below. The lower case 720 is coupled to the bottom of the upper case 710.

As illustrated in FIGS. 4, 6 and 7, the lower case 720 is coupled to the band coupling frame 600 with the wrist band 500 interposed therebetween. The lower case 720 is coupled to the upper case 710, and forms the lower portion of the mounting space in which the module frame 730 is mounted. For this structure, the lower case 720 may be formed in a cylindrical shape which is open upward, and have a smaller height than the upper case 710. However, the lower case 720 may have a larger height, and the upper case 710 may have a smaller height.

The lower case 720 has a module seating part 721 which is defined by first and second partition walls 721a and 721b so as to seat the module frame 730 therein. The module seating part 721 has a switch coupling part 722 and a switch seating groove 723, which are formed on one side thereof. The module seating part 721 may have a plurality of hooks 724 formed at the top of the inside thereof.

The module seating part 721 has a plurality of boss grooves 725 and a plurality of coupling bosses 726, which are formed at the outer bottom surface thereof. The plurality of first fastening bosses 610 are inserted into the plurality of boss grooves 725, respectively, and the plurality of coupling bosses 726 are formed to be spaced apart from the boss grooves 725, and coupled to the second fastening bosses 620.

The module frame 730 is seated in the module seating part 721 which is defined by the first and second partition walls 721a and 721b disposed to face each other. The first and second partition walls 721a and 721b are spaced apart from each other so as to correspond to the size and shape of the module frame 730. The first and second partition walls 721a and 721b are formed in a flat bar shape, and have one end integrated with one side of the inner circumferential surface of the lower case 720 and the other end extended in the opposite direction. The switch coupling part 722 and the switch seating groove 723 in which the switch 780 to be described below is seated are formed adjacent to any one of the first and second partition walls 721a and 721b.

As illustrated in FIG. 6, the switch coupling part 722 has a slit 722a which is formed by cutting one side of the outer circumferential surface of the lower case 720 in the height direction of the lower case 720, such that a knob 782 of the switch 780 can be exposed to the outside. A pair of vertical ribs 722b are formed with the slit 722a interposed therebetween. Furthermore, a pair of third partition walls 722c are formed adjacent to the vertical ribs 722b, in order to guide the insertion position of the switch 780 and to prevent separation of the switch 780. Each of the third partition walls 722c may be disposed to have a cross-section at an angle of 90° with the corresponding vertical rib 722b, while having a larger width than the vertical rib 722b.

The switch seating groove 723 has a shape corresponding to the switch-side structure of the module frame 730 to be described below and the shape of the switch 780, and is concavely formed on the inner bottom surface of the lower case 720.

At least the pair of hooks 724 may be installed at positions facing each other. Since the upper case 710 is inserted into the lower case 720, the hooks 724 are formed on the inner circumferential surface of the lower case 720. However, when the upper case 710 is formed in such a shape as to cover the lower case 720 from the outside, the hooks 724 may be formed on the outer circumferential surface of the lower case 720. The hooks 724 may be formed at positions corresponding to the hook holes 712a of the upper case 710. For stable coupling, the plurality of hooks 724 may be formed.

As illustrated in FIG. 7, the plurality of boss grooves 725 are formed on the outer bottom surface of the lower case 720, and the plurality of coupling bosses 726 are formed so as to be spaced apart from the boss grooves 725.

The boss grooves 725, into which the first fastening bosses 610 of the band coupling frame 600 are inserted, are formed concavely toward the inside from the outer bottom surface of the lower case 720. The boss grooves 725 are formed at positions corresponding to the first fastening bosses 610, and the number of the boss grooves 725 corresponds to the number of the first fastening bosses 610.

The coupling bosses 726 are coupled to the second fastening bosses 620 of the band coupling frame 600. However, the coupling bosses 726 are not coupled to the second fastening bosses 620, but may serve to press the wrist band 500. In this case, the second fastening bosses 620 may also serve to press the wrist band 500 so as not to move.

Although not illustrated in the drawings, a receiving coil for wireless charging may be inserted into the bottom surface of the lower case 720. The receiving coil for wireless charging may be controlled to automatically charge the transmitting device B when the transmitting device B is mounted on the wireless charging coil pad installed on the cart A.

As illustrated in FIGS. 8 to 11, the module frame 730, the module UWB antenna 740, the module sub PCB 750, the module main PCB 760 and the battery 770 are received in the upper case 710 and the lower case 720 which have the above-described structures.

As illustrated in FIGS. 9 to 11, the module frame 730 is a support structure in which the module UWB antenna 740, the module sub PCB 750, the module main PCB 760 and the battery 770 are mounted. The module frame 730 has a substantially U-shaped structure, and the module UWB antenna 740, the module sub PCB 750, the module main PCB 760 and the battery 770 are coupled to the module frame 730 so as to be stacked in multi-stages.

One side of the module frame 730 is open, and the other side thereof, corresponding to the open one side, is closed. Therefore, the module UWB antenna 740, the module sub PCB 750, the module main PCB 760 and the battery 770 may be inserted through the open one side in a sliding manner.

The module frame 730 has a pair of first guide ribs 731 formed at the bottom thereof so as to face each other, and pairs of second to fourth guide ribs 732, 734 and 735 formed above the pair of first guide ribs 731 so as to face each other. The pairs of first to fourth guide ribs 731, 732, 734 and 735 are extended from side surfaces of the module frame 730 in the inward direction that each pair of guide ribs face each other.

The battery 770 is inserted between the first guide ribs 731 and the second guide ribs 732 from the bottom of the module frame 730, and this insertion region is defined as a first insertion part 730a. The module main PCB 760 is inserted between the second guide ribs 732 and the third guide ribs 734, and this insertion region is defined as a second insertion part 730b. The module sub PCB 750 is inserted between the third guide ribs 734 and the fourth guide ribs 735, and the module UWB antenna 740 is inserted onto the module sub PCB 750. This insertion region is defined as a third insertion part 730c. In the second insertion part 730b, a first separation rib 733 may be additionally formed to prevent the module main PCB 760 from moving. However, the first separation rib may be omitted by adjusting the heights of the first to third insertion parts or adjusting the widths of the first to fourth guide ribs.

The module frame 730 may have a plurality of second separation ribs 736 and a plurality of third separation ribs 737, which are formed on both side surfaces thereof, respectively, and separately guide various signal lines so as not to overlap one another. The numbers of the second separation ribs 736 and the third separation ribs 737 may be changed according to the required number of signal lines.

The module frame 730 may have a support block 738 formed at one side surface thereof so as to prevent movement of the switch 780 when the switch 780 is coupled.

The support block 738 may be formed in substantially a rectangular parallelepiped shape. The support block 738 may be brought in surface contact with the top and rear surfaces of the switch 780, and prevent the movement of the switch 780. For this structure, a protrusion may be formed on the top surface of the support block 738 so as to be contacted with the top surface of the switch 780.

In this way, all of the main components may be mounted on the one module frame 730, and the module frame 730 having the main components mounted thereon may be mounted on the lower case 720. Thus, the main components may be fixed at a time, which makes it possible to improve the workability. From the top of the module frame 730, the main components will be described as follows.

As illustrated in FIGS. 8 to 10, the module UWB antenna 740 is electrically connected to the module sub PCB 750 by the antenna connector 742. The module UWB antenna 740 may transmit a position signal of the transmitting device B or receive a signal from the UWB antenna 182 installed in the cart A, and then transmit the signal to the UWB main PCB 187 of the cart A. The UWB antennas 182 installed in the cart A are disposed at a preset interval provided therebetween, and serve as a transceiver. Therefore, when the UWB antennas 182 installed in the cart A and the module UWB antennas 182 installed in the transmitting module 700 are utilized, the controller may sense and determine the position of the transmitting module 700 using various methods. The method for sensing and following the position of the transmitting module 700 may be performed according to PCT/KR2019/001184 published on Jan. 28, 2019.

The module sub PCB 750 serves to connect the module main PCB 760 and the module UWB antenna 740. The module sub PCB 750 has various circuits mounted therein, and the various circuits are electrically connected to the module UWB antenna 740, and transfer a signal of the module UWB antenna 740 to the module main PCB 760 through communication with the module UWB antenna 740.

The module main PCB 760 is mounted under the module sub PCB 750 and electrically connected to the module sub PCB 750. The module main PCB 760 is electrically connected to the battery 770 and the switch 780, and controls the battery 770 and the switch 780. The module main PCB 760 may have an LED lamp 762 mounted thereon to display an operation state. The LED lamp 762 may be turned on/off according to a turn-on/off of the switch 780, or controlled to be lit in a different color when turned on/off. The module main PCB 760 exchanges signals through communication with the UWB main PCB 187 mounted in the cart A.

The battery 770 is mounted under the module main PCB 760, and serves to supply power to a portion within the transmitting device B, which needs power. The battery 770 may be charged by a wired or wireless charging method, charged by a separate charger, or mounted on the cart A so as to be charged through the cart A.

As illustrated in FIGS. 7 to 10, the switch 780 has a substantially rectangular parallelepiped shape, and includes the knob 782 for an on/off operation and a connector 784 electrically connected to the module main PCB 760.

The knob 782 is exposed to the outside on the switch 780, and raised or lowered to turn on/off the switch 780. The knob 782 is coupled to the support block 738 of the module frame 730 and seated in the switch seating groove 723 of the lower case 720. At this time, the knob 782 is exposed to the outside of the slit 722a of the switch coupling part 722.

The connector 784 may serve to simply couple the switch 780 to the support block 738 of the module frame 730. In addition, the connector 784 may be electrically connected to a signal line or circuit which is not illustrated in the drawings. The connector 784 may be implemented as a plurality of pins installed on both side surfaces of the switch 780, facing each other. Alternatively, the connector 784 may be formed on the rear surface of the switch 780 (the opposite surface of the knob), and inserted into the support block 738 of the module frame 730.

As such, the transmitting device for a cart in accordance with the embodiment of the present disclosure provides the sensing and communication function such that the cart for providing the auto following function can sense and follow the position of the transmitting device. Therefore, the cart can sense and follow the position of the transmitting device.

Furthermore, the transmitting device for a cart in accordance with the embodiment of the present disclosure can be conveniently worn like a watch, thereby improving the user's convenience.

Furthermore, the transmitting device for a cart in accordance with the embodiment of the present disclosure is mounted on the cart and automatically charged. Therefore, a separate part for charging is not necessary.

Although the present disclosure has been described with reference to the drawings, the present disclosure is not limited to the embodiments and drawings disclosed in this specification, but it is obvious that various modifications can be made by a person skilled in the art within the scope of the present disclosure. Although an operation effect by a component of the present disclosure is not explicitly described while the embodiments of the present disclosure are described, it is obvious that an expectable effect by the corresponding component needs to be recognized.

INDUSTRIAL APPLICABILITY

The transmitting device for a cart in accordance with the embodiment of the present disclosure may be used for various fields such as the commercial field, the leisure field and the distribution field.

The invention claimed is:

1. A transmitting device for a cart, comprising:
a band-shaped wrist band configured to be worn around a user's wrist; and
a transmitter detachably coupled to the wrist band, the transmitter being configured to transfer position information to the cart through communication with the cart,
wherein the transmitter comprises:
an upper case having a mounting space formed therein;
a lower case disposed under the upper case, the lower case being coupled to the upper case to provide the mounting space therein; and
a frame inserted into the mounting space between the upper case and the lower case,
wherein the frame has a U-shaped structure in which one side is open and an other side is closed, and a pair of first guide ribs, a pair of second guide ribs, a pair of third guide ribs and a pair of fourth guide ribs are formed from bottom to top in an inner direction facing each other from both sides of the frame, and
wherein a battery is inserted between the first guide ribs and the second guide ribs, a main printed circuit board (PCB) is inserted between the second guide ribs and the third guide ribs above the battery, a sub PCB is inserted between the third guide ribs and the fourth guide ribs above the main PCB, and an ultra-wideband (UWB) antenna is disposed above the sub PCB.

2. The transmitting device of claim 1, wherein the main PCB is configured to transmit and receive a signal to and from the UWB antenna and control the battery.

3. The transmitting device of claim 1, wherein the transmitter further comprises a switch located on one side of the upper case or the lower case, the switch having an on/off knob exposed to an outside of the upper case or the lower case and controlled by the main PCB.

4. The transmitting device of claim 1, wherein the transmitter further comprises an LED lamp located on the main PCB, the LED lamp being turned on/off or controlled to be lit in a different color by the main PCB according to the turn-on/off state of the switch.

5. The transmitting device of claim 1, wherein the UWB antenna, the sub PCB, the main PCB and the battery are sequentially stacked in a direction from the upper case toward the lower case.

6. The transmitting device of claim 1, wherein the upper case has an antenna hole formed through a portion of the top surface thereof corresponding to a position of the UWB antenna, or a portion corresponding to the position of the UWB antenna has a smaller plate thickness than other portions of the upper case.

7. The transmitting device of claim 1, wherein the lower case has a wireless-charging receiving coil installed therein, the wireless-charging receiving coil being configured to wirelessly charge the battery when placed close to a wireless-charging transmitting coil of the cart.

8. The transmitting device of claim 1, further comprising a band coupling frame detachably coupled to the wrist band and to the bottom of the transmitter with the wrist band interposed therebetween.

9. The transmitting device of claim 8, wherein the wrist band, the band coupling frame and the transmitter are made of an insulating material.

10. The transmitting device of claim 9, wherein a coupling structure of the wrist band, the band coupling frame and the transmitter is implemented through coupling between a hook and a hook groove or coupling between a protrusion-shaped coupling boss and a coupling groove having a shape corresponding to the protrusion.

11. The transmitting device of claim 8, wherein the band coupling frame has a plurality of first fastening bosses and a plurality of second fastening bosses which are coupled to the transmitter and protrude toward the top surface.

12. The transmitting device of claim 11, wherein the first fastening bosses are coupled to the bottom of the lower case of the transmitter through a fastening hole formed in the wrist band, and formed in a cylindrical shape.

13. The transmitting device of claim 12, wherein the plurality of second fastening bosses are formed at positions which do not interfere with the wrist band with the first fastening bosses coupled to the wrist band, and coupled to the lower case of the transmitter to guide the coupling position of the wrist band.

14. The transmitting device of claim 13, wherein the second fastening bosses have a cylindrical shape, the second fastening bosses being inserted into holes of the lower case to be coupled to the lower case, or inserted into coupling bosses provided on the lower case to be coupled to the lower case.

15. The transmitting device of claim 14, wherein the lower case is coupled to the band coupling frame with the wrist band interposed therebetween, in order to form the mounting space therein under the upper case of the transmitter.

16. The transmitting device of claim 15, wherein the lower case has seating part which is defined by a first partition wall and a second partition wall to seat the frame, therein, and
   wherein the seating part has a switch coupling part and a switch seating groove which are formed on one side thereof, and a plurality of hooks formed at the top of the inside thereof.

17. The transmitting device of claim 16, wherein the seating part includes:
   a plurality of boss grooves located on an outer bottom surface of the seating part such that the first fastening bosses are inserted into the boss grooves; and
   a plurality of coupling bosses spaced apart from the boss grooves and coupled to the second fastening bosses.

18. The transmitting device of claim 15, wherein the lower case includes:
   a plurality of boss grooves provided on an outer bottom surface of the lower case; and
   a plurality of coupling bosses spaced apart from the boss grooves,
   wherein the plurality of boss grooves into which the first fastening bosses of the band coupling frame are inserted are formed concavely toward an inside from the outer bottom surface of the lower case.

* * * * *